(12) United States Patent
Tsorng et al.

(10) Patent No.: US 12,238,886 B2
(45) Date of Patent: Feb. 25, 2025

(54) APPARATUS FOR INSTALLING PCIE ADD-IN CARDS IN A COMPUTING SYSTEM

(71) Applicant: Quanta Computer Inc., Taoyuan (TW)

(72) Inventors: Yaw-Tzorng Tsorng, Taoyuan (TW); Tung-Hsien Wu, Taoyuan (TW); Chia-Hung Kao, Taoyuan (TW); Jun-Zhe Weng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 206 days.

(21) Appl. No.: 18/162,882

(22) Filed: Feb. 1, 2023

(65) Prior Publication Data
US 2024/0260221 A1  Aug. 1, 2024

(51) Int. Cl.
*H05K 7/14* (2006.01)
*G06F 1/18* (2006.01)

(52) U.S. Cl.
CPC ........... *H05K 7/1461* (2013.01); *G06F 1/185* (2013.01); *H05K 7/1407* (2013.01); *H05K 7/1418* (2013.01)

(58) Field of Classification Search
CPC ...... H05K 7/1461; H05K 7/184; H05K 7/185; H05K 7/1407; H05K 7/1418
USPC ........ 361/752, 728, 796, 800, 807, 809, 810
See application file for complete search history.

(56) References Cited

U.S. PATENT DOCUMENTS

| | | | |
|---|---|---|---|
| 10,973,139 B1* | 4/2021 | Tsorng | H05K 7/1424 |
| 2004/0190228 A1* | 9/2004 | Shi | H05K 7/1408 361/539 |
| 2009/0067136 A1* | 3/2009 | Cheney | H05K 7/1431 361/726 |
| 2022/0114130 A1* | 4/2022 | Lin | G06F 13/4221 |
| 2023/0324963 A1* | 10/2023 | Wu | G06F 1/185 |

FOREIGN PATENT DOCUMENTS

CN  108594969 A  *  9/2018  ............. G06F 1/185

* cited by examiner

*Primary Examiner* — Hung S. Bui
(74) *Attorney, Agent, or Firm* — NIXON PEABODY LLP

(57) ABSTRACT

A riser bracket for a computing device includes a plurality of structural members configured to receive a computing component and an adjustable fixing bracket mechanically coupled to the plurality of structural members. The adjustable fixing bracket has a plurality of configurations that includes a first configuration and a second configuration. The adjustable fixing bracket has a first height in the first configuration that is greater than a second height in the second configuration. The adjustable fixing bracket includes a first slide bracket that is slidably mounted to a support bracket. The support bracket is fixed relative to the first slide bracket and the plurality of structural members. The first slide bracket is slidable along the support bracket to change the adjustable fixing bracket between the first configuration and the second configuration.

20 Claims, 16 Drawing Sheets

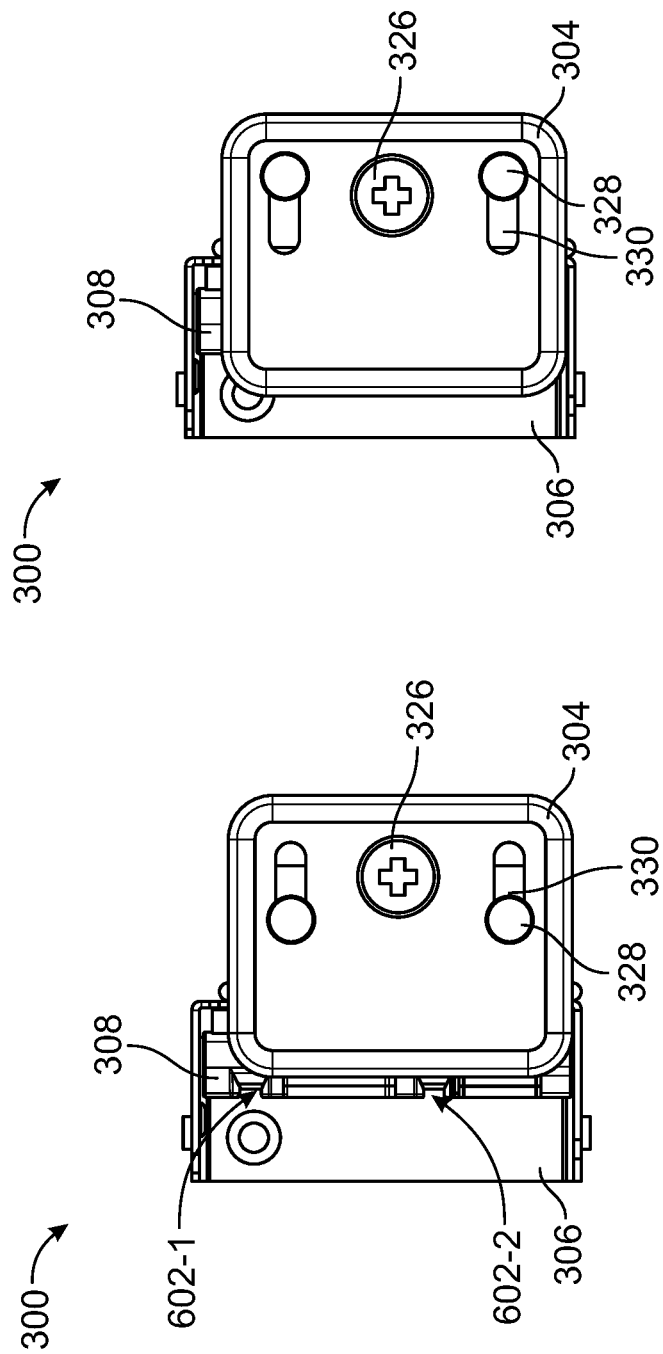

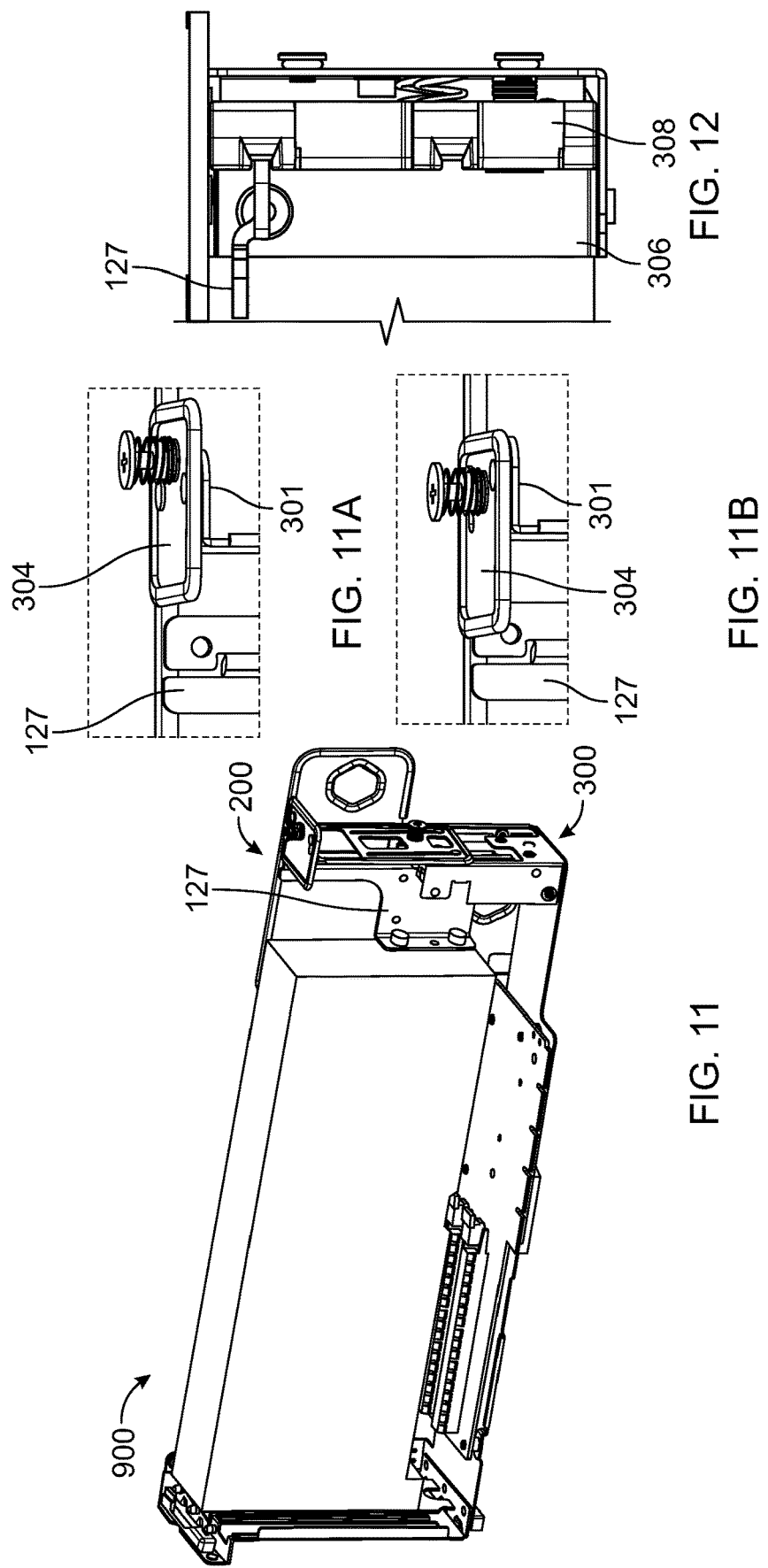

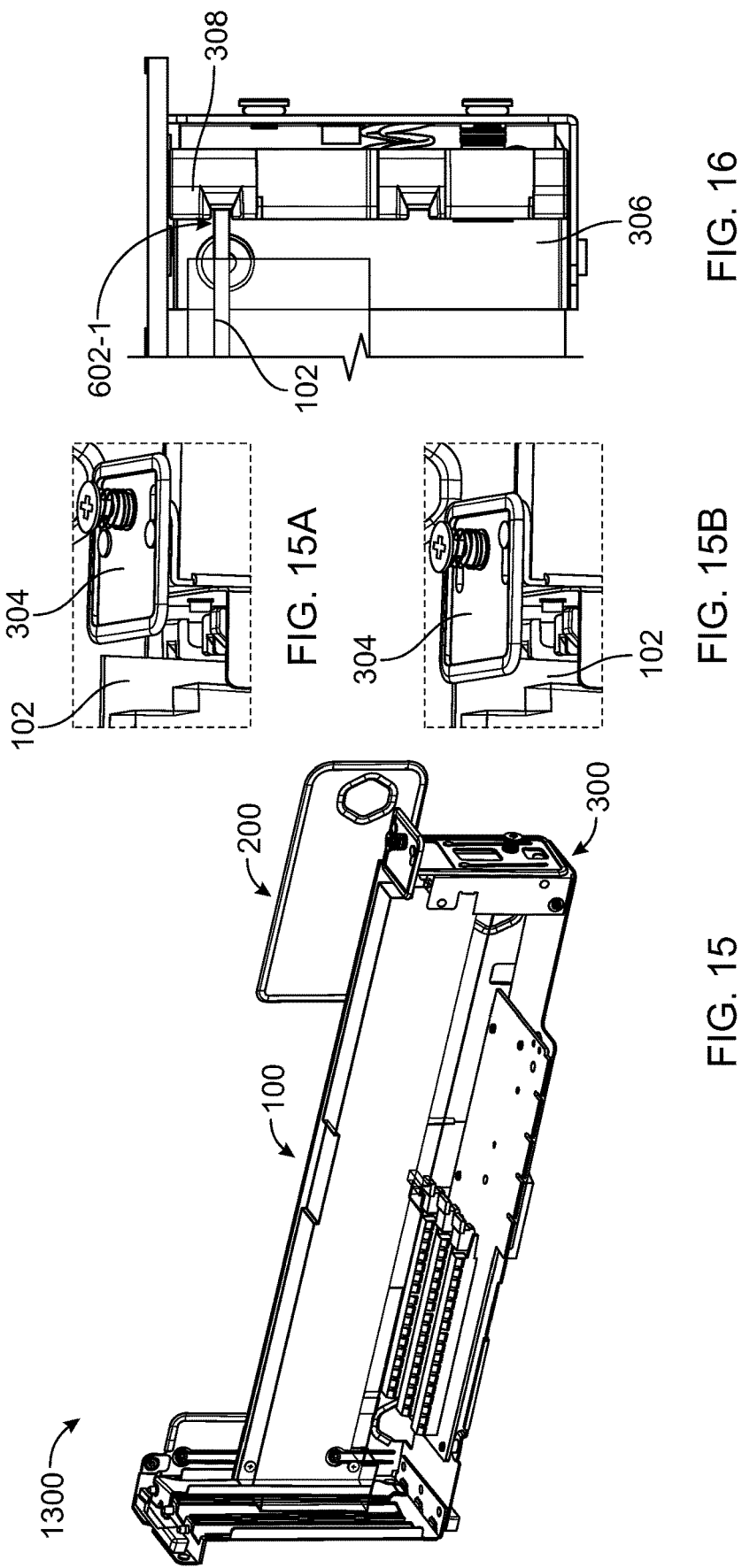

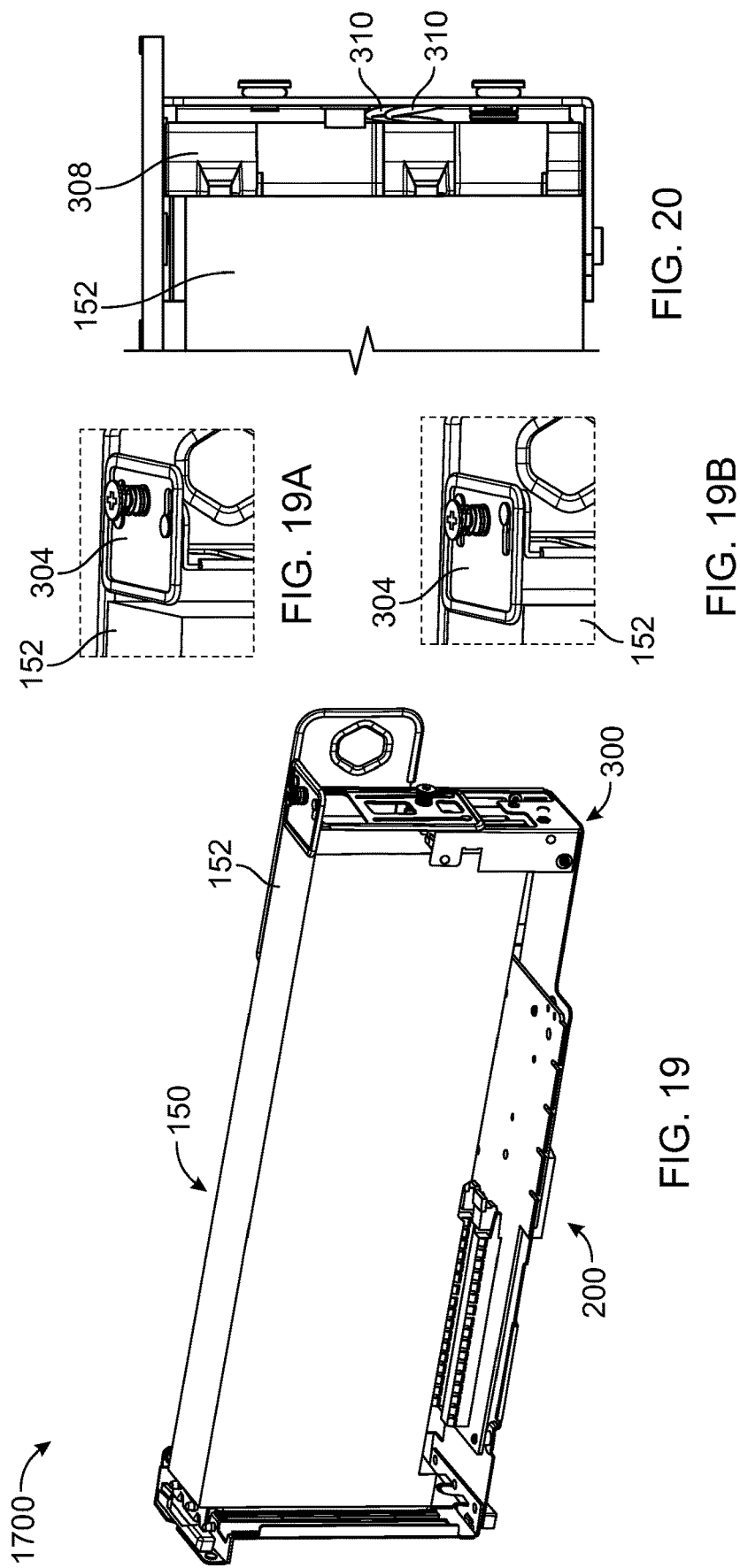

APPARATUS FOR INSTALLING PCIE ADD-IN CARDS IN A COMPUTING SYSTEM

TECHNICAL FIELD

The present disclosure relates generally to systems and methods for installing Peripheral Component Interconnect Express (PCIe) add-in cards in a computing system.

BACKGROUND

Servers are employed in many applications ranging from high-performance computing to database storage. Servers enable many computing application solutions that have come to be relied upon. For example, servers may support mobile application solutions such as mobile mapping applications, mobile payment systems, text messaging, computation offloading, web browsing, etc. Mobile customers are usually unaware of extensive support being provided by servers in everyday use of their mobile devices. Although mobile customers may not consider server-side support in everyday use of mobile devices, components that make up the server affects performance of the server, and in some cases, features available for computing. Thus, servers sometimes need to be configured to include specific components or need to be upgradable to include specific components.

The components needed typically depend on service being provided. For example, a server may require installation of a PCIe card or swapping out a first PCIe card for a second PCIe card. PCIe cards can differ in physical size based on the functionality of the PCIe cards. Therefore, when a different sized PCIe card is installed in a computing system, fit of the PCIe card can be a problem. The present disclosure provides ways of reducing issues relating to fit of PCIe cards in computing systems.

SUMMARY

Some implementations of the present disclosure provide a riser bracket for a computing device. The riser bracket includes a plurality of structural members configured to receive a computing component and an adjustable fixing bracket mechanically coupled to the plurality of structural members. The adjustable fixing bracket has a plurality of configurations that includes a first configuration and a second configuration. The adjustable fixing bracket has a first height in the first configuration that is greater than a second height in the second configuration. The adjustable fixing bracket includes a first slide bracket that is slidably mounted to a support bracket. The support bracket is fixed relative to the first slide bracket and the plurality of structural members. The first slide bracket is slidable along the support bracket to change the adjustable fixing bracket between the first configuration and the second configuration.

In an embodiment, the riser bracket further includes a riser board attached to the plurality of structural members and configured to provide one or more slots for interfacing with a PCIe card. In an embodiment, the plurality of structural members includes a back panel, a floor panel, and a side bracket. The back panel is attached to the side bracket and the adjustable fixing bracket, and the floor panel is attached to the side bracket and the adjustable fixing bracket. In an embodiment, the back panel includes one or more ventilation openings. In an embodiment, the support bracket is attached to both the back panel and the floor panel. In an embodiment, the first height is about the height of a full-height PCIe card, and the second height is about the height of a half-height PCIe card.

In an embodiment, the adjustable fixing bracket further includes a card guide coupled to the support bracket. In an embodiment, the card guide is coupled to the support bracket via a spring. In an embodiment, the card guide includes one or more openings for ventilation. In an embodiment, the adjustable fixing bracket further includes a second slide bracket coupled to the first slide bracket. The second slide bracket is configured to slide in a direction orthogonal to the sliding direction of the first slide bracket. In an embodiment, the second slide bracket, the first slide bracket, or both have a range of motion limited by one or more rails.

In an embodiment, the riser bracket further includes one or more screws to lock the adjustable fixing bracket in the first configuration and/or the second configuration. In an embodiment, the first slide bracket, the support bracket, or both, include one or more openings for ventilation. In an embodiment, a length of the first slide bracket is greater than a length of the support bracket, and a width of the first slide bracket is about the same as a width of the support bracket.

Some implementations of the present disclosure provide a computing device including a chassis, a motherboard coupled to the chassis, and a riser bracket. The riser bracket includes a plurality of structural members to receive a computing component and an adjustable fixing bracket coupled to the plurality of structural members. The adjustable fixing bracket has a plurality of configurations that includes a first configuration and a second configuration. The adjustable fixing bracket has a first height in the first configuration that is greater than a second height in the second configuration. The adjustable fixing bracket includes a first slide bracket and a second slide bracket. The first slide bracket is slidably mounted to a support bracket. The support bracket is fixed relative to the first slide bracket and the plurality of structural members. The first slide bracket is slidable along the support bracket to change the adjustable fixing bracket between the first configuration and the second configuration. The second slide bracket is slidably mounted to the first slide bracket. The second slide bracket is slidable along the first slide bracket to secure a PCIe card in the riser bracket.

In an embodiment, the first height is about the height of a full-height PCIe card and the second height is about the height of a half-height PCIe card. In an embodiment, the adjustable fixing bracket further includes a card guide coupled to the support bracket. The card guide is configured to engage with at least a portion of the PCIe card or at least a portion of an extender of the PCIe card. In an embodiment, the card guide, the support bracket, the first slide bracket, or any combination thereof, includes one or more openings for ventilation. In an embodiment, a sliding range of motion for the first slide bracket and/or the second slide bracket is restricted by one or more rails. In an embodiment, the first slide bracket, the second slide bracket, or both, are prevented from sliding by one or more screws.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIG. 6A illustrates a top plan view of a slide bracket of the adjustable fixing bracket of FIG. 3 in an unlocked position, according to some implementations of the present disclosure.

FIG. 6B illustrates a top plan view of the slide bracket of the adjustable fixing bracket of FIG. 3 in a locked position, according to some implementations of the present disclosure.

FIG. 11 illustrates locking the dual-slot three-quarter length PCIe card of FIG. 1E in place, according to some implementations of the present disclosure.

FIG. 11A illustrates the dual-slot three-quarter length PCIe card unlocked, according to some implementations of the present disclosure.

FIG. 11B illustrates the dual-slot three-quarter length PCIe card locked, according to some implementations of the present disclosure.

FIG. 12 illustrates a top plan view of the card guide of the adjustable fixing bracket of FIG. 3 interfacing with the dual-slot three-quarter length PCIe card of FIG. 1E.

FIG. 15 illustrates locking the half-height PCIe card of FIG. 1A in place, according to some implementations of the present disclosure.

FIG. 15A illustrates the half-height PCIe card unlocked, according to some implementations of the present disclosure.

FIG. 15B illustrates the half-height PCIe card locked, according to some implementations of the present disclosure.

FIG. 16 illustrates a top plan view of the card guide of the adjustable fixing bracket of FIG. 3 interfacing with the half-height PCIe card of FIG. 1A.

FIG. 19 illustrates locking the dual-slot full-length PCIe card of FIG. 1F in place, according to some implementations of the present disclosure.

FIG. 19A illustrates the dual-slot full-length PCIe card unlocked, according to some implementations of the present disclosure.

FIG. 19B illustrates the dual-slot full-length PCIe card locked, according to some implementations of the present disclosure.

FIG. 20 illustrates a top plan view of the card guide of the adjustable fixing bracket of FIG. 3 interfacing with the dual-slot full-length PCIe card of FIG. 1F.

Figure 1A:
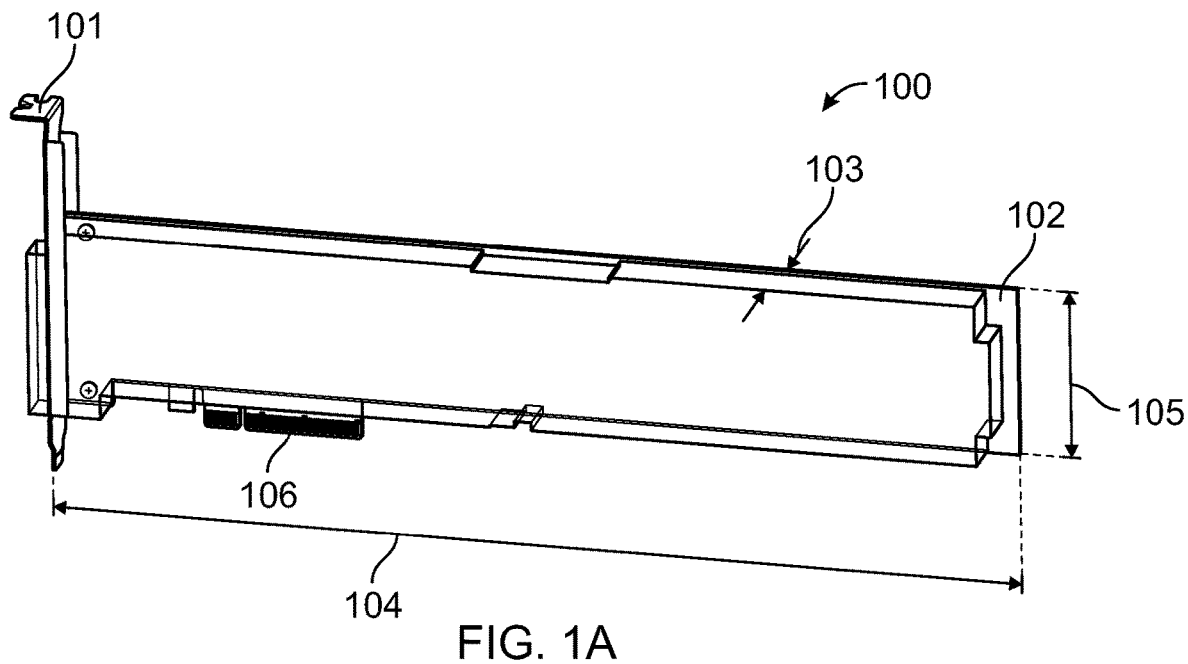
FIG. 1A illustrates a perspective view of a half-height PCIe card.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Embodiments of the present disclosure provide a peripheral component interconnect express riser bracket with an adjustable fixing bracket. The adjustable fixing bracket includes a first slide bracket that can be positioned in a first vertical position or a second vertical position. When the first slide bracket is moved from the first vertical position to the second vertical position, a height of the adjustable fixing bracket changes from a first height to a second height. An advantage of being able to change the height of the adjustable fixing bracket is that different sized PCIe cards can be locked in the PCIe riser bracket. As such, a computing system provided in accordance with embodiments of the present disclosure can provide more flexibility to manufacturers and customers when installing or swapping out different sized PCIe cards in the computing system.

PCIe (and GPU) cards come in different sizes. In first example, FIG. 1A illustrates a perspective view of a half-height PCIe card 100. The half-height PCIe card 100 includes an L-bracket 101 attached to a circuit board 102. The circuit board 102 has a PCIe connector 106 for connecting to a motherboard or some other printed circuit board assembly (PCBA). The half-height PCIe card 100 has a width 103, a length 104, and a height 105. In some implementations, the width 103 is about 39 mm, the length 104 is about 312 mm, and the height 105 is about 56 mm. In some implementations, having the width 103 of about 19 mm indicates that the half-height PCIe card 100 is a single slot PCIe card.

Figure 1B:
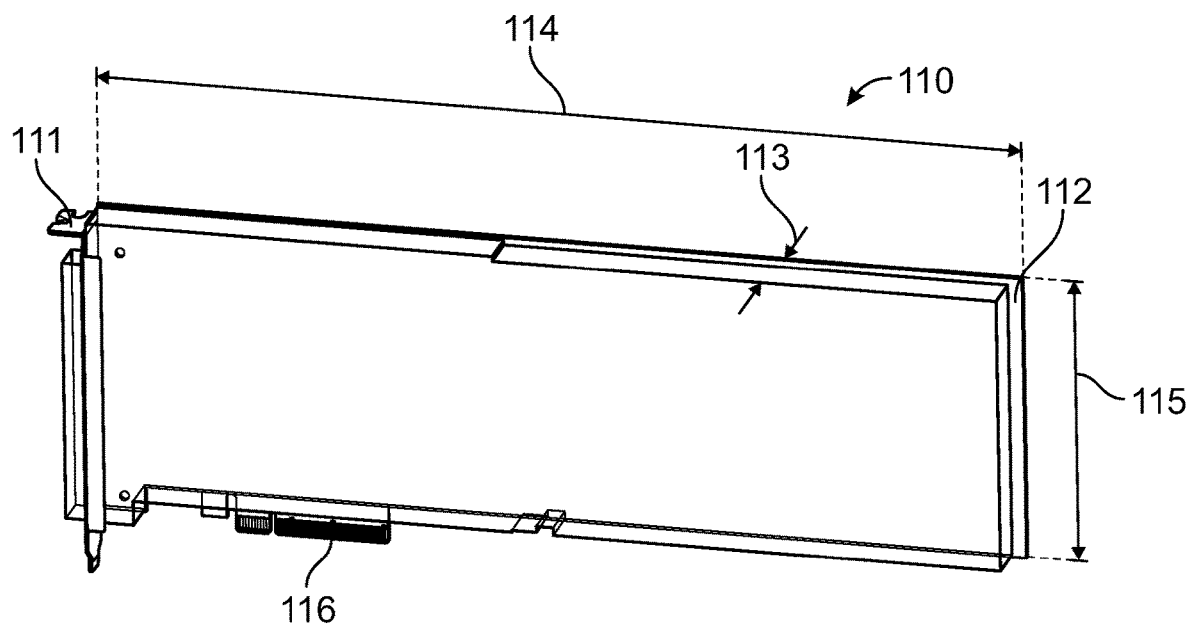
FIG. 1B illustrates a perspective view of a full-height PCIe card.

In a second example, FIG. 1B illustrates a perspective view of a full-height PCIe card 110. The full-height PCIe card 110 includes an L-bracket 111 attached to a circuit board 112. The circuit board 112 has a PCIe connector 116 for connecting to a motherboard or some other PCBA. The full-height PCIe card 110 has a width 113, a length 114, and a height 115. In some implementations, the width 113 is about 19 mm, the length 114 is about 312 mm, and the height 115 is about 98 mm.

Figure 1C:
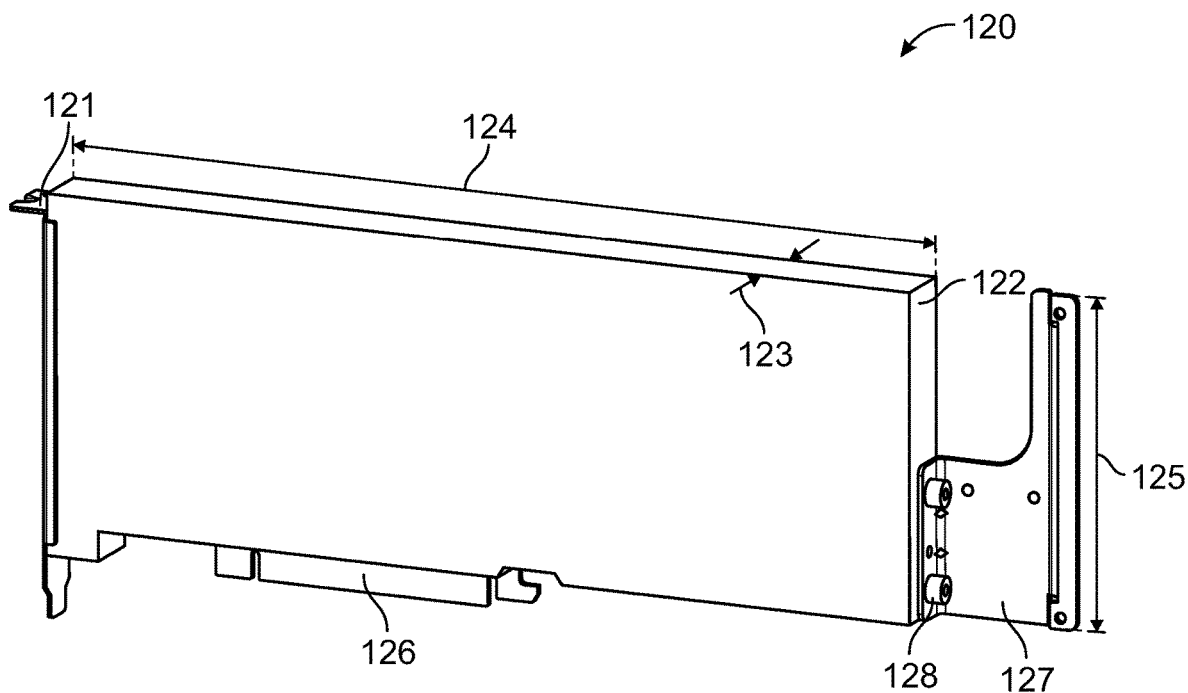
FIG. 1C illustrates a perspective view of a single-slot three-quarter length PCIe card.

In a third example, FIG. 1C illustrates a perspective view of a single-slot three-quarter length PCIe card 120. The single-slot three-quarter length PCIe card 120 includes an L-bracket 121 attached to a circuit board 122. The circuit board 122 has a PCIe connector 126 for connecting to a motherboard or some other PCBA. The single-slot three-quarter length PCIe card 120 further includes an extender 127 attached to the circuit board 122 via one or more fastening devices 128. In some implementations, the fastening devices 128 are screws. The single-slot three-quarter length PCIe card 120 has a width 123, a length 124, and a height 125. In some implementations, the width 123 is about 19 mm, the length 124 is about 268 mm, and the height 125 is about 98 mm. The extender 127 artificially lengthens the single-slot three-quarter length PCIe card 120.

Figure 1D:
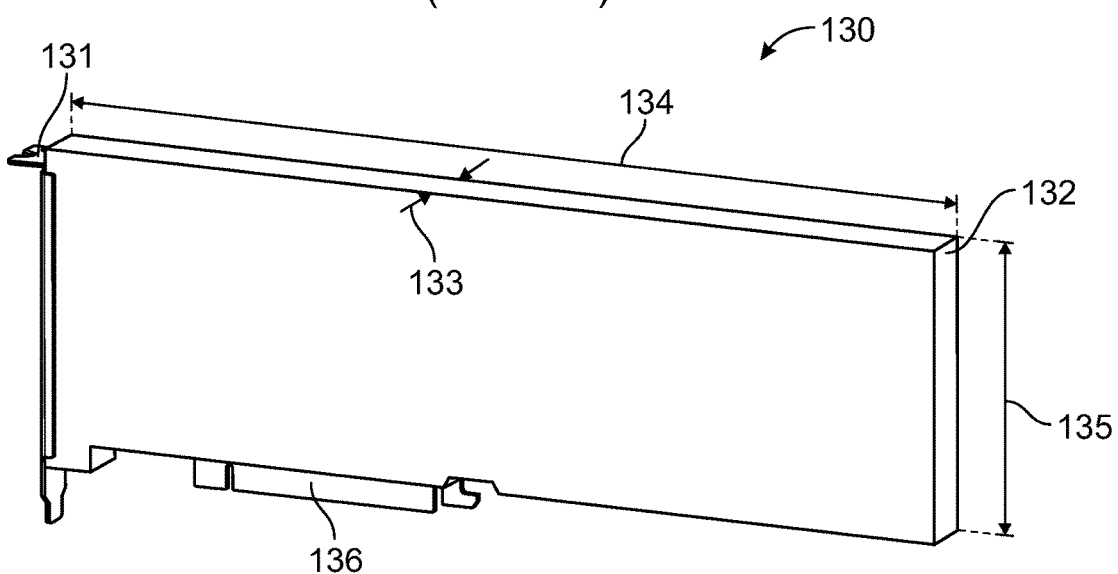
FIG. 1D illustrates a perspective view of a single-slot full-length PCIe card.

In a fourth example, FIG. 1D illustrates a perspective view of a single-slot full-length PCIe card 130. The single-slot full-length PCIe card 130 is similar to the full-height PCIe card 110. The single-slot full-length PCIe card 130 includes an L-bracket 131 attached to a circuit board 132. The circuit board 132 has a PCIe connector 136 for connecting to a motherboard or some other PCBA. The single-slot full-length PCIe card 130 has a width 133, a length 134, and a height 135.

Figure 1E:
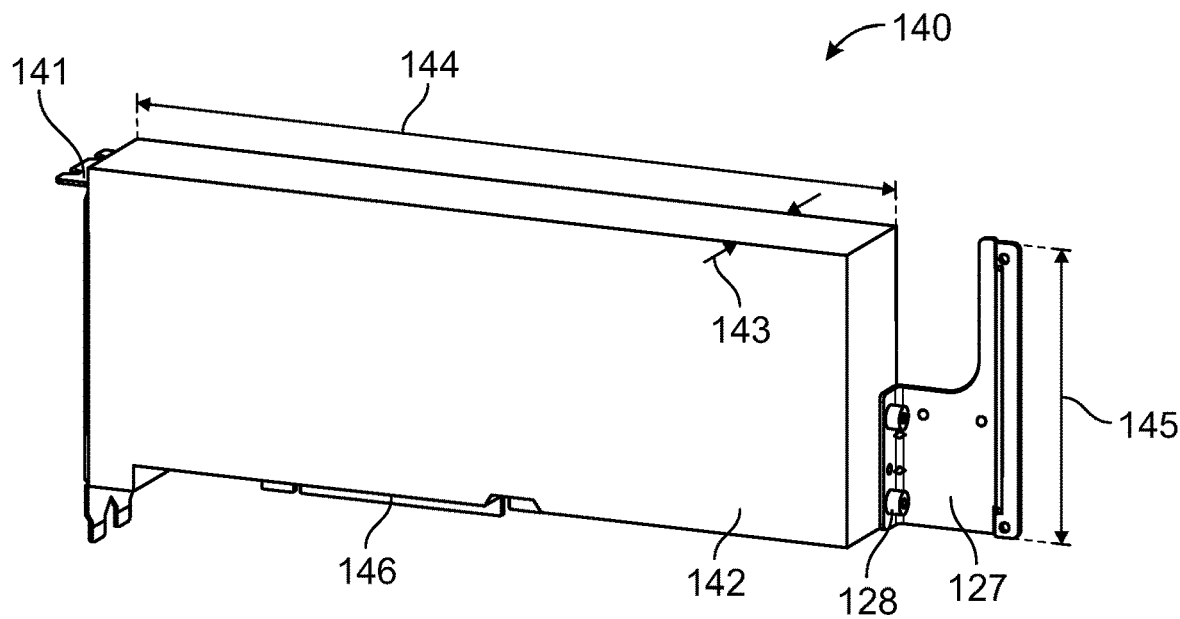
FIG. 1E illustrates a perspective view of a dual-slot three-quarter length PCIe card.

In a fifth example, FIG. 1E illustrates a perspective view of a dual-slot three-quarter length PCIe card 140. The dual-slot three-quarter length PCIe card 140 includes an L-bracket 141 attached to a circuit board 142. The circuit board 142 has a PCIe connector 146 for connecting to a motherboard or some other PCBA. The dual-slot three-quarter length PCIe card 140 has a width 143, a length 144, and a height 145. Similar to the single-slot three-quarter length PCIe card 120 (FIG. 1C), the dual-slot three-quarter length PCIe card 140 further includes the extender 127. The width 143 covers about two slots on the motherboard or PCBA, and in some implementations, the width 143 is about 39 mm.

Figure 1F:
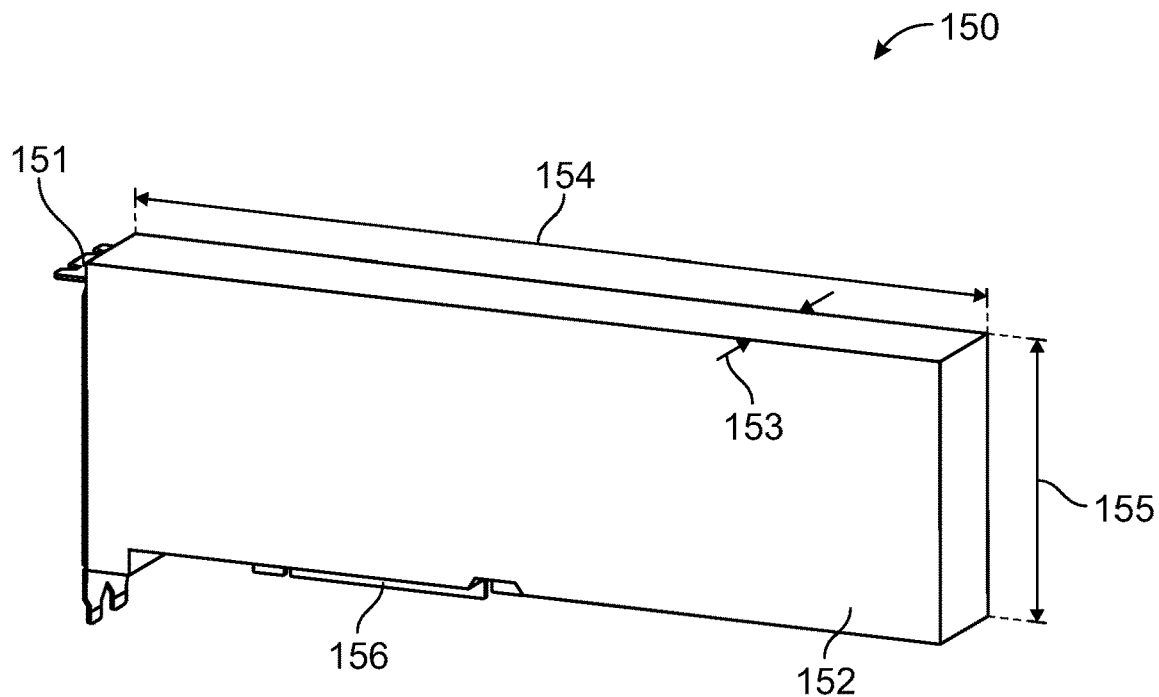
FIG. 1F illustrates a perspective view of a dual-slot full-length PCIe card.

In a sixth example, FIG. 1F illustrates a perspective view of a dual-slot full-length PCIe card 150. The dual-slot full-length PCIe card 150 includes an L-bracket 151 attached to a circuit board 152. The circuit board 152 has a PCIe connector 156 for connecting to a motherboard or some other PCBA. The dual-slot full-length PCIe card 150 has a width 153, a length 154, and a height 155. In some implementations, the width 153 is about 39 mm, the length 154 is about 312 mm, and the height 155 is about 98 mm.

As discussed in connection with FIGS. 1A-1F, PCIe cards can come in different sizes. In some implementations, extenders are used to approximate a full sized PCIe card. In some implementations, PCIe cards are single slot or dual slot cards. PCIe cards are sometimes installed in PCIe riser brackets which are then installed in the computing systems.

Figure 2:
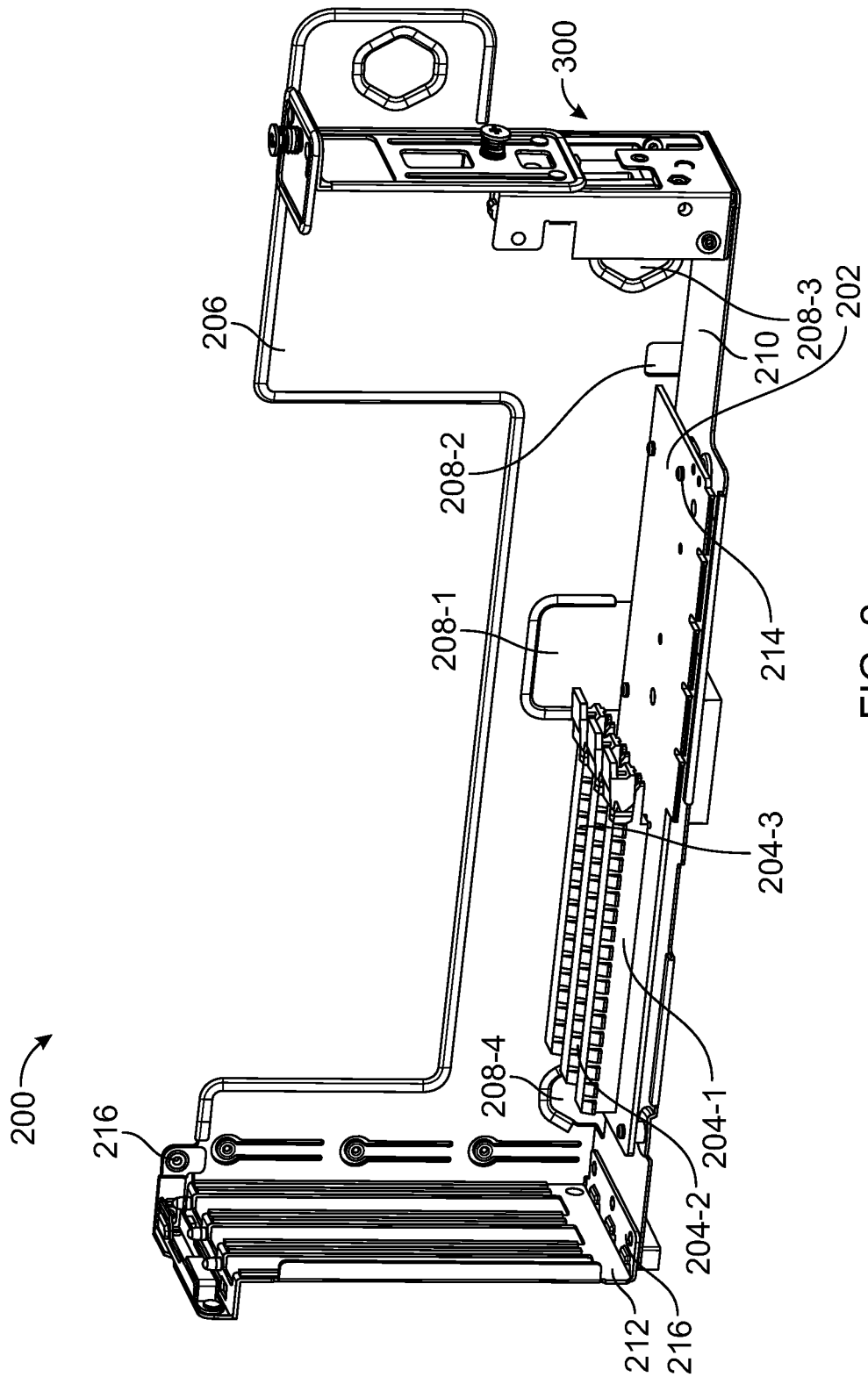
FIG. 2 illustrates a perspective view of a PCIe riser bracket, according to some implementations of the present disclosure.

FIG. 2 illustrates a perspective view of a PCIe riser bracket 200, according to some implementations of the present disclosure. The PCIe riser bracket 200 includes a back panel 206, a floor panel 210, and a side bracket 212, and an adjustable fixing bracket 300. The back panel 206, the floor panel 210, and the side bracket 212 are structural members that shape the PCIe riser bracket 200. The adjustable fixing bracket 300 is located opposite the side bracket 212. The adjustable fixing bracket 300 is attached to the floor panel 210 and the back panel 206. Similarly, the side bracket 212 is attached to the back panel 206 and the floor panel 210. Fastening devices 216 (e.g., screws) can be used to attach the side bracket 212 to the back panel 206 and/or the floor panel 210. The back panel 206 may include one or more openings 208-1, 208-2, 208-3, 208-4 for ventilation. The PCIe riser bracket 200 further includes a riser board 202 having one or more PCIe slots 204-1, 204-2, 204-3 for receiving PCIe card(s). The riser board 202 is attached to the floor panel 210 using fastening devices 214.

Figure 3:
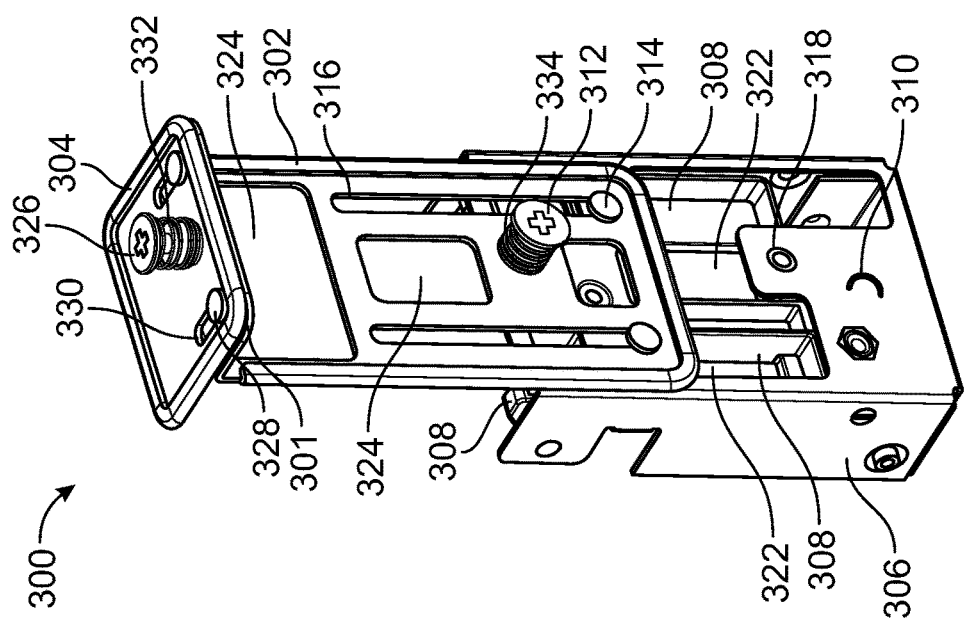
FIG. 3 illustrates a perspective view of an adjustable fixing bracket of the PCIe riser bracket of FIG. 2 in a first configuration, according to some implementations of the present disclosure.

FIG. 3 illustrates a perspective view of the adjustable fixing bracket 300 in a first configuration, according to some implementations of the present disclosure. The adjustable fixing bracket 300 includes a first slide bracket (e.g., a vertical slide bracket 302), a second slide bracket (e.g., a horizontal slide bracket 304), a support bracket 306, and a card guide 308. For clarity and ease in description, "vertical" and "horizontal" are used to describe the first slide bracket and the second slide bracket, respectively. The terms "vertical" and "horizontal" merely distinguish between the slide brackets and do not limit specific orientation of the slide brackets.

Figure 4:
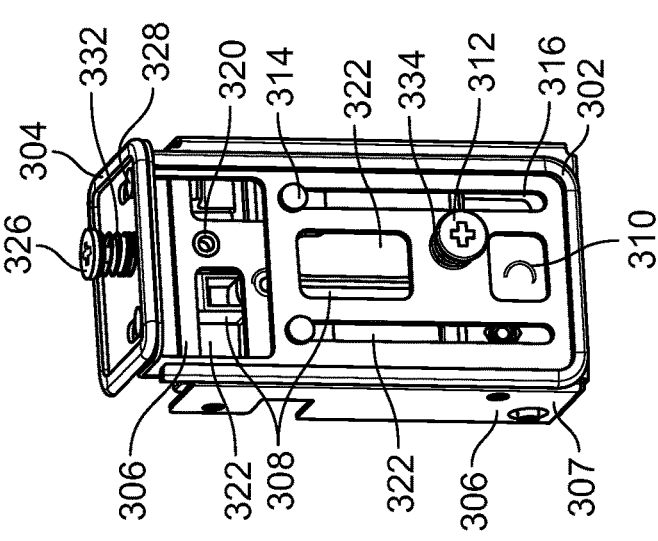
FIG. 4 illustrates a perspective view of the adjustable fixing bracket of FIG. 3, according to some implementations of the present disclosure.

The vertical slide bracket 302 includes one or more openings 324 for ventilation. The vertical slide bracket 302 includes one or more rails 316 that facilitate sliding the vertical slide bracket 302 along the support bracket 306. The support bracket 306 includes one or more buttons 314 that engage the one or more rails 316 to guide the sliding of the vertical slide bracket 302. The one or more buttons 314 cooperate with the one or more rails 316 to define a degree of motion of the vertical slide bracket 302. When the adjustable fixing bracket 300 is in the first configuration, a height of the adjustable fixing bracket 300 is at maximum. The one or more buttons 314 engage the vertical slide bracket 302 at a first end of the one or more rails 316. The vertical slide bracket 302 can be prevented from sliding (or locked into position) by tightening a screw 312 which engages a nut 320 (FIG. 4) in the first configuration. A spring 334 can be wrapped around the screw 312 for ease in disengaging the screw 312 from the nut 320 (FIG. 4).

The horizontal slide bracket 304 is coupled to the vertical slide bracket 302. One or more buttons 328 provided on the vertical slide bracket 302 engage with one or more rails 330 of the horizontal slide bracket 304. In a similar manner as described above with respect to the vertical slide bracket 302, the one or more buttons 328 and the one or more rails 330 of the horizontal slide bracket 304 define a degree of horizontal sliding motion for the horizontal slide bracket 304. The one or more buttons 328 are provided on a horizontally bent portion 301 of the vertical slide bracket 302. A screw 326 is provided for securing the horizontal slide bracket 304 at a preferable position. Similar to the spring 334 provided for the screw 312, a spring 332 can be provided for ease in disengaging the screw 326. The horizontal slide bracket 304 is positioned orthogonal to the vertical slide bracket 302, and the sliding motion of the horizontal slide bracket 304 is in a plane orthogonal to the sliding motion of the vertical slide bracket 302.

The support bracket 306 is coupled to the vertical slide bracket 302 via the one or more buttons 314 engaging the one or more rails 316. The one or more buttons 314, having a larger diameter than the width of the one or more rails 316, prevent the vertical slide bracket 302 from disengaging from the support bracket 306. Furthermore, the support bracket includes nuts (e.g., a nut 318 and the nut 320 of FIG. 4) that can receive one or more screws (e.g., the screw 312) to lock or secure the vertical slide bracket 302 in place. When locked or secured, the vertical slide bracket 302 does not slide along the one or more rails 316.

The card guide 308 is coupled to the support bracket 306 using one or more springs (e.g., spring 310). The spring 310 allows for some compression when a PCIe card is installed in the PCIe riser bracket 200 (FIG. 2). That is, the card guide 308 can be pushed towards the support bracket 306 by the installed PCIe card, and the compressed spring 310 can provide some tension that holds the installed PCIe card in place. The card guide 308 can be a plastic component, while the vertical slide bracket 302, the horizontal slide bracket 304, and the support bracket 306 can be metal components. The card guide 308 can include one or more openings 322 for ventilation.

FIG. 4 illustrates a perspective view of the adjustable fixing bracket 300 in a second configuration, according to some implementations of the present disclosure. Although two configurations (i.e., the first configuration and the second configuration) are provided in FIGS. 3 and 4, the adjustable fixing bracket can be configured for more than two configurations. For example, by providing, along the range of motion of the vertical slide bracket 302, more than two nuts 318, 320 on the support bracket 306, more than two configurations are achievable. In the second configuration, the screw 312 engages with the nut 318 (FIG. 3). The one or more buttons 314 are at an opposite end of the one or more rails 316.

As the vertical slide bracket 302 slides from the first configuration to the second configuration, an overlap between the vertical slide bracket 302 and the support bracket 306 increases. The overlap is at a minimum in the first configuration and at a maximum in the second configuration. In some implementations, in the second configuration, the vertical slide bracket 302 covers a substantial portion of the support bracket 306, with the width of the vertical slide bracket 302 being about the same as a width of the support bracket 306. In some implementations, a height of the vertical slide bracket 302 is greater than a height of the support bracket 306. In some implementations, in the second configuration, a bottom of the vertical slide bracket 302 is flush with a bottom of the support bracket 306. When transitioning from the first configuration to the second configuration, the one or more openings 324 on of the vertical slide bracket 302 change positions to coincide or overlap with at least a portion of the one or more openings 322 on the card guide 308.

Figure 5:
FIG. 5 illustrates a perspective view of a support bracket and card guide of the adjustable fixing bracket of FIG. 3, according to some implementations of the present disclosure.

FIG. 5 illustrates a perspective view of the support bracket 306 and the card guide 308 of the adjustable fixing bracket 300 (FIGS. 3 and 4), according to some implementations of the present disclosure. In FIG. 5, both of the nuts 318 and 320 are visible. Various openings 322 are highlighted.

FIG. 6A illustrates a top plan view of the horizontal slide bracket 304 of the adjustable fixing bracket 300 in an unlocked position, according to some implementations of the present disclosure. The card guide 308 includes one or more slots 602-1, 602-2 for receiving at least a portion of a PCIe card or at least a portion of an extender of a PCIe card. In the unlocked position, the one or more slots 602-1, 602-2 are accessible due to the positioning of the horizontal slide bracket 304 relative to the one or more buttons 328. FIG. 6B illustrates a top plan view of the horizontal slide bracket 304 of the adjustable fixing bracket 300 in a locked position, according to some implementations of the present disclosure. In the locked position, the one or more slots 602-1, 602-2 (FIG. 6A) are not accessible due to the positioning of the horizontal slide bracket 304 relative to the one or more buttons 328.

Figure 8:
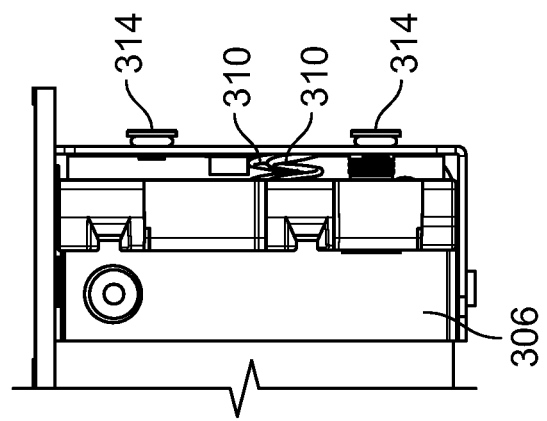
FIG. 8 illustrates a top view of the card guide of the adjustable fixing bracket of FIG. 3, according to some implementations of the present disclosure.
Figure 7:
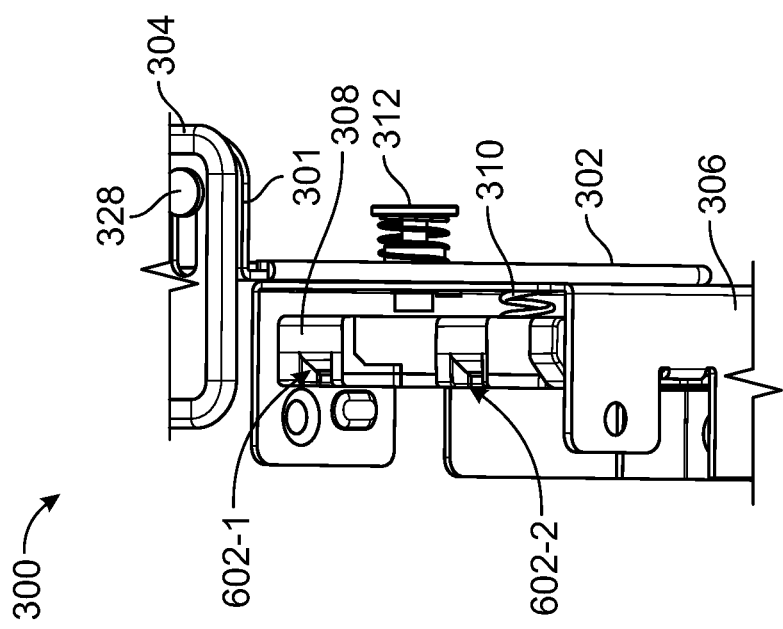
FIG. 7 illustrates a perspective view of the card guide of the adjustable fixing bracket of FIG. 3, according to some implementations of the present disclosure.

FIG. 7 illustrates a perspective view of the card guide 308 of the adjustable fixing bracket 300, according to some implementations of the present disclosure. The card guide 308 facilitates holding PCIe cards and/or GPU cards in place. The spring 310 connects the card guide 308 to the support bracket 306. In some implementations, the spring 310 suspends the card guide 308 in air. FIG. 8 illustrates a top view of the card guide 308 and the support bracket 306 without the vertical slide bracket 302 and the horizontal slide bracket 304.

Figure 9:
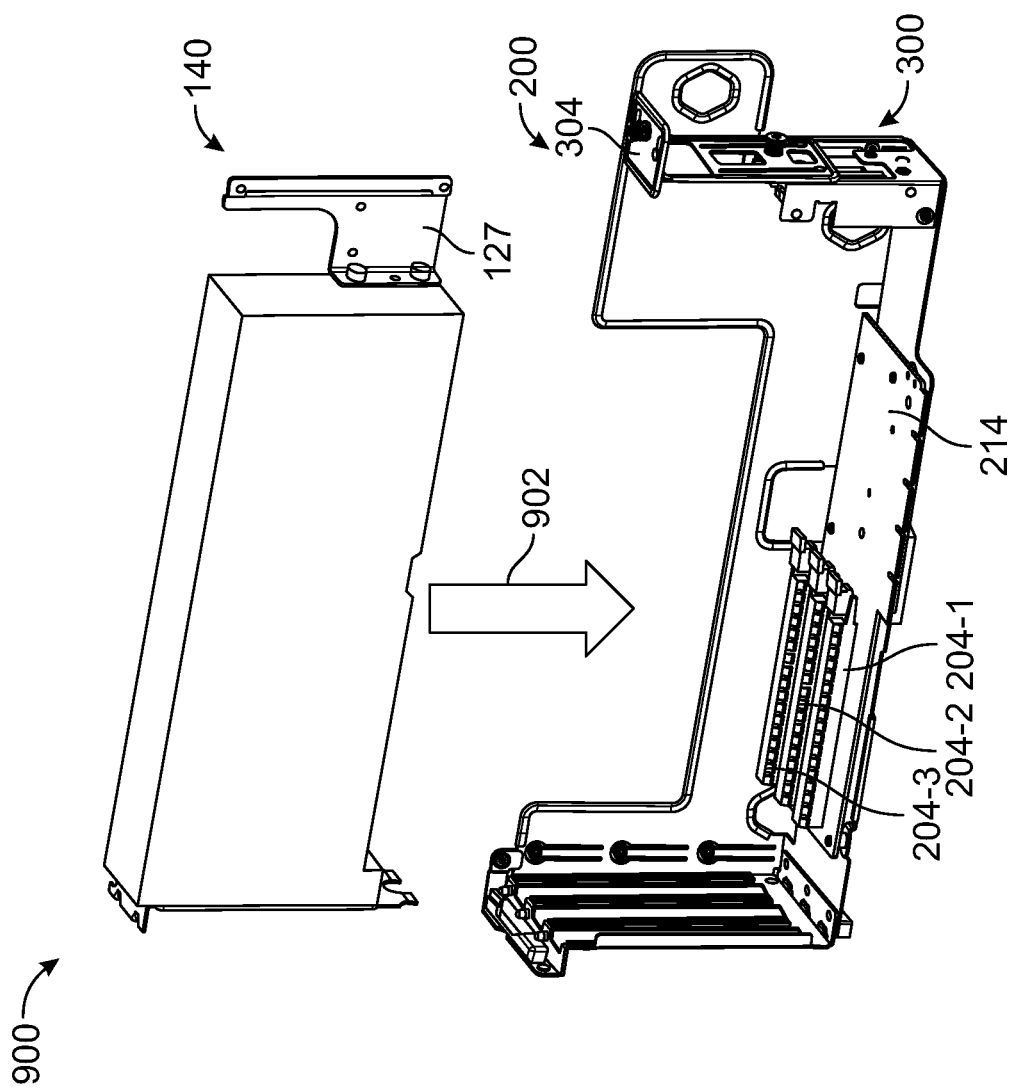
FIG. 9 illustrates components of a first PCIe module that includes the dual-slot three-quarter length PCIe card of FIG. 1E and the PCIe riser bracket of FIG. 2, according to some implementations of the present disclosure.

FIG. 9 illustrates components of a first PCIe module 900 that includes the dual-slot three-quarter length PCIe card 140 and the PCIe riser bracket 200, according to some implementations of the present disclosure. While the horizontal slide bracket 304 is unlocked, the PCIe riser bracket 200 receives the dual-slot three-quarter length PCIe card 140 in the direction 902. Although FIG. 9 shows that the adjustable fixing bracket 300 is in the first configuration, as long as the horizontal slide bracket 304 is unlocked, the height can be adjusted after the dual-slot three-quarter length PCIe card 140 has been inserted in the PCIe riser bracket 200.

Figure 10:
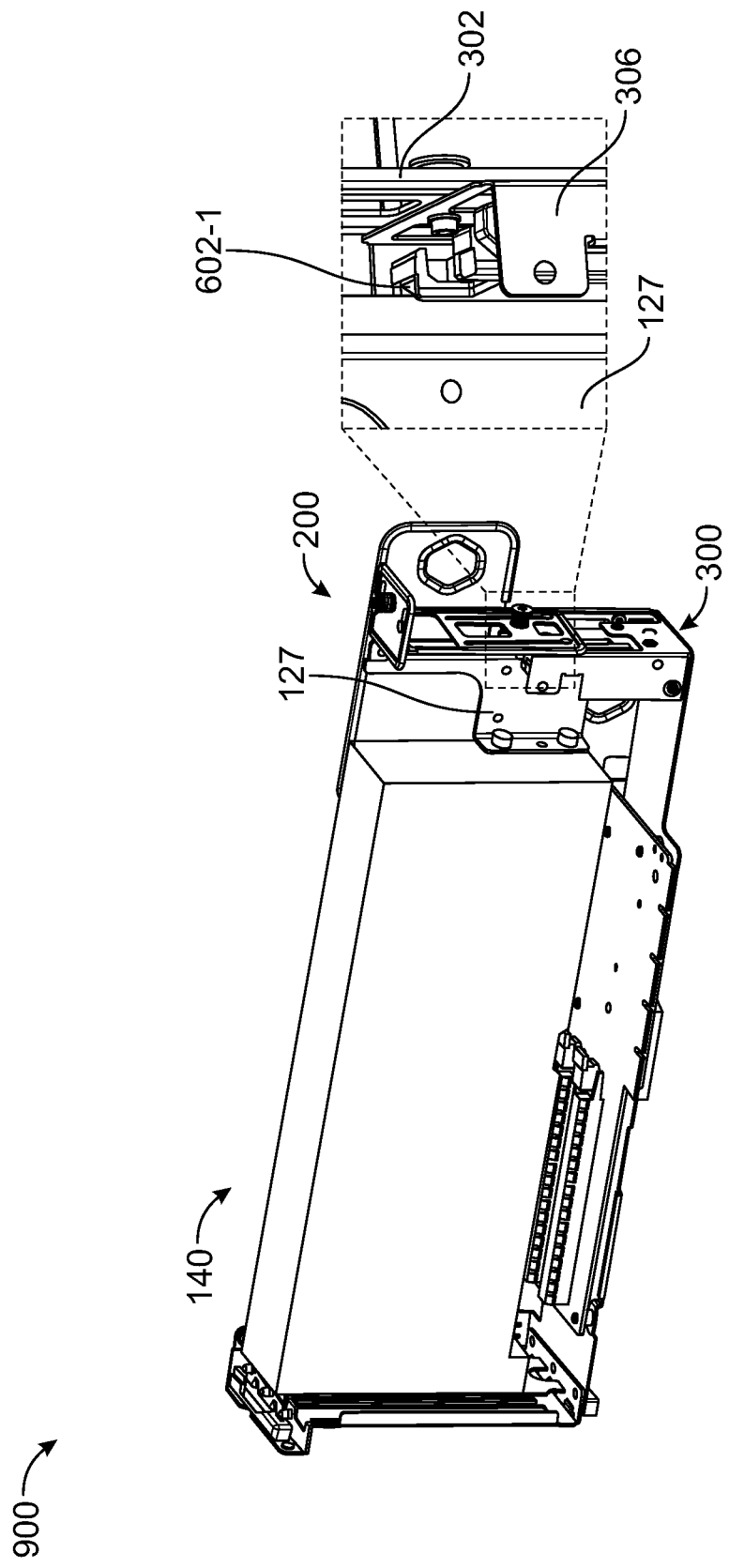
FIG. 10 illustrates the first PCIe module after the dual-slot three-quarter length PCIe card of FIG. 1E is inserted in the PCIe riser bracket of FIG. 2, according to some implementations of the present disclosure.

FIG. 10 illustrates the first PCIe module 900 after the dual-slot three-quarter length PCIe card 140 is inserted in the PCIe riser bracket 200, according to some implementations of the present disclosure. The extender 127 of the dual-slot three-quarter length PCIe card 140 is received at the slot 602-1. FIG. 11 illustrates locking the dual-slot three-quarter length PCIe card 140 in place, according to some implementations of the present disclosure. The horizontal slide bracket 304 slides from the unlocked position (FIG. 11A) to the locked position (FIG. 11B). In the locked position, the horizontal slide bracket 304 overhangs the extender 127, while in the unlocked position, the horizontal slide bracket 304 is clear of the extender 127. FIG. 12 illustrates a top plan view of the card guide 308 interfacing with the extender 127 of the dual-slot three-quarter length PCIe card 140.

Figure 13:
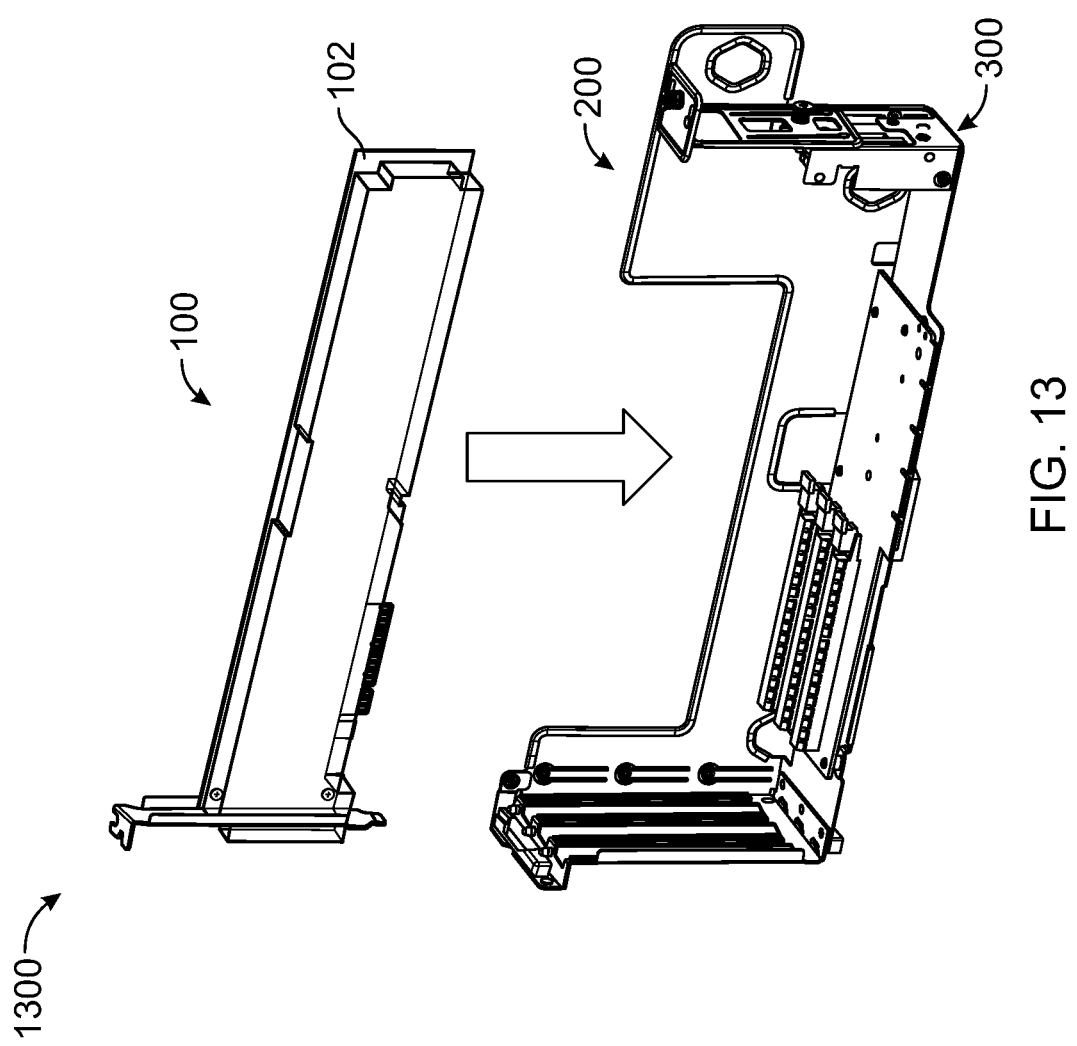
FIG. 13 illustrates components of a second PCIe module that includes the half-height PCIe card of FIG. 1A and the PCIe riser bracket of FIG. 2, according to some implementations of the present disclosure.

FIG. 13 illustrates components of a second PCIe module 1300 that includes the half-height PCIe card 100 and the PCIe riser bracket 200, according to some implementations of the present disclosure. While the horizontal slide bracket 304 is unlocked, the PCIe riser bracket 200 receives the half-height PCIe card 100 in the direction indicated by the arrow.

Figure 14:
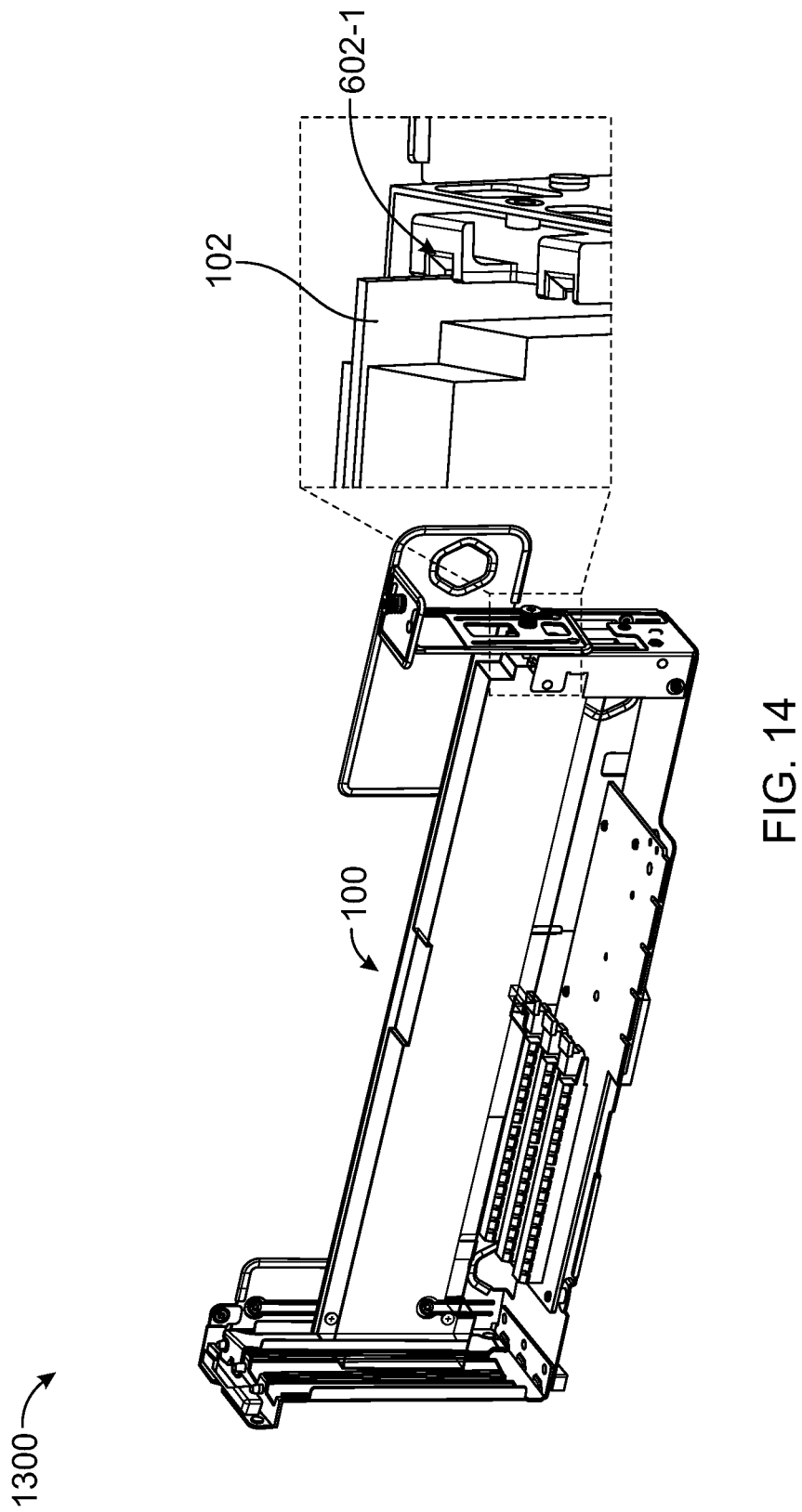
FIG. 14 illustrates the second PCIe module after the half-height PCIe card of FIG. 1A is inserted in the PCIe riser bracket of FIG. 2, according to some implementations of the present disclosure.

FIG. 14 illustrates the second PCIe module 1300 after the half-height PCIe card 100 is inserted in the PCIe riser bracket 200, according to some implementations of the present disclosure. The circuit board 102 of the half-height PCIe card 100 engages the slot 602-1 of the card guide 308. FIG. 15 illustrates locking the half-height PCIe card 100 in place, according to some implementations of the present disclosure. The horizontal slide bracket 304 slides from the unlocked position (FIG. 15A) to the locked position (FIG. 15B). In the locked position, the horizontal slide bracket 304 overhangs the circuit board 102, while in the unlocked position, the horizontal slide bracket 304 is clear of the circuit board 102. Compared to FIG. 14, in FIG. 15, the adjustable fixing bracket 300 is placed in the second configuration. FIG. 16 illustrates a top plan view of the card guide 308 interfacing with the half-height PCIe card 100.

Figure 17:
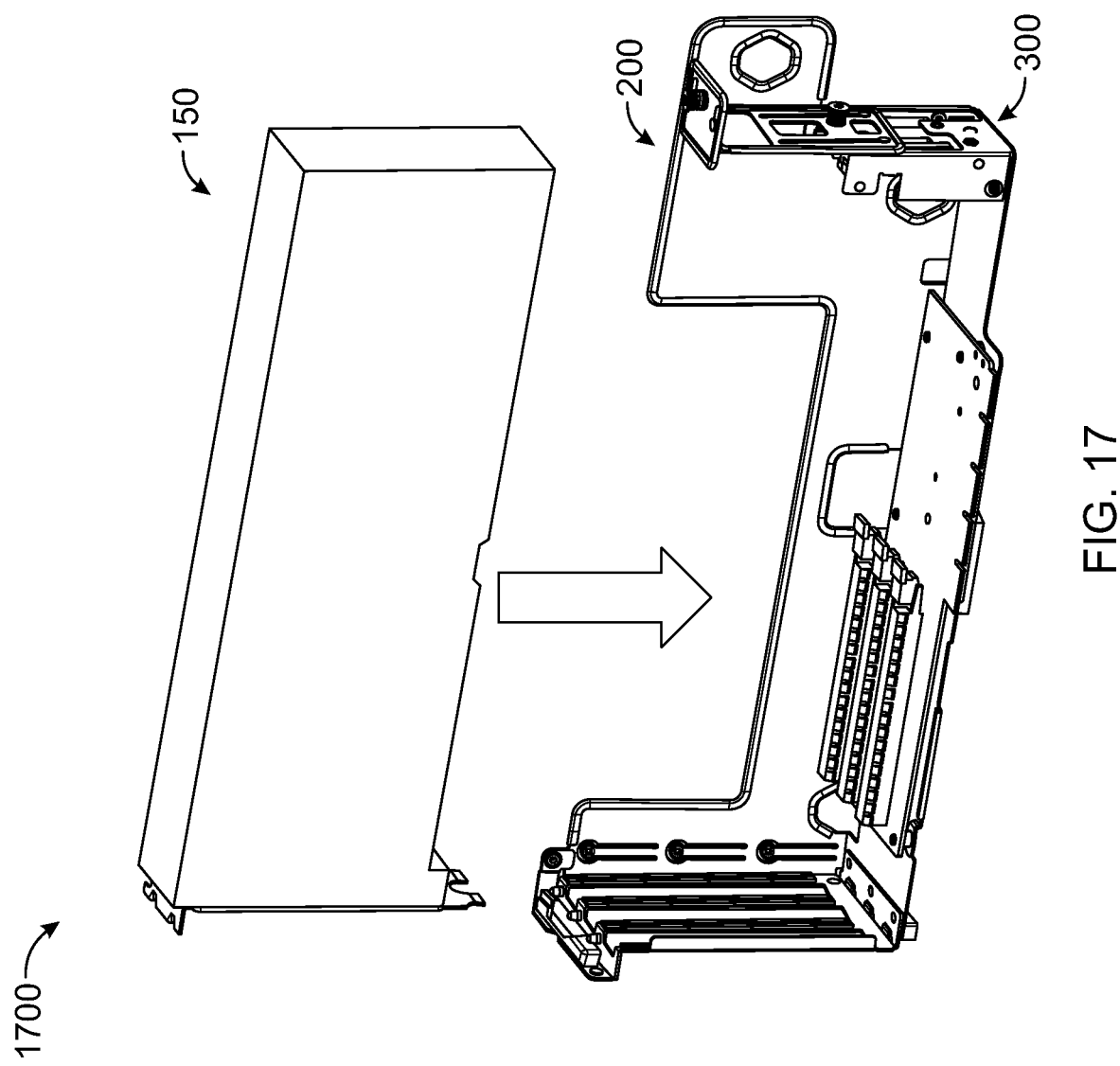
FIG. 17 illustrates components of a third PCIe module that includes the dual-slot full-length PCIe card of FIG. 1F and the PCIe riser bracket of FIG. 2, according to some implementations of the present disclosure.

FIG. 17 illustrates components of a third PCIe module 1700 that includes the dual-slot full-length PCIe card 150 and the PCIe riser bracket 200, according to some implementations of the present disclosure. While the horizontal slide bracket 304 is unlocked, the PCIe riser bracket 200 receives the dual-slot full-length PCIe card 150 in the direction indicated by the arrow.

Figure 18:
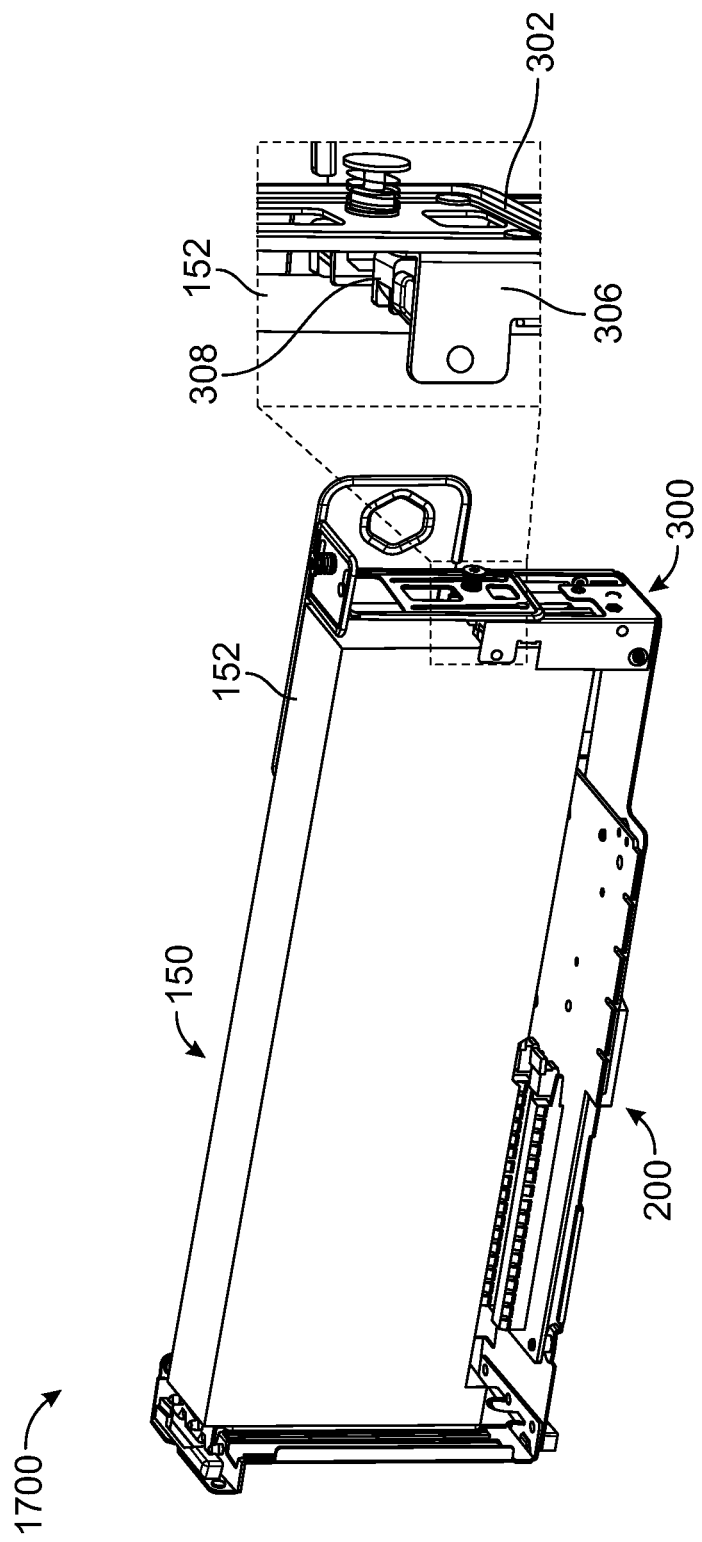
FIG. 18 illustrates the third PCIe module after the dual-slot full-length PCIe card of FIG. 1F is inserted in the PCIe riser bracket of FIG. 2, according to some implementations of the present disclosure.

FIG. 18 illustrates the third PCIe module 1700 after the dual-slot full-length PCIe card 150 is inserted in the PCIe riser bracket 200, according to some implementations of the present disclosure. The circuit board 152 of the dual-slot full-length PCIe card 150 pushes against the card guide 308. FIG. 19 illustrates locking the dual-slot full-length PCIe card 150 in place, according to some implementations of the present disclosure. The horizontal slide bracket 304 slides from the unlocked position (FIG. 19A) to the locked position (FIG. 19B). In the locked position, the horizontal slide bracket 304 overhangs the circuit board 152, while in the unlocked position, the horizontal slide bracket 304 is clear of the circuit board 152. FIG. 20 illustrates a top plan view of the card guide 308 interfacing with the dual-slot full-length PCIe card 150. Because the circuit board 152 does not engage either of the slots 602-1, 602-2, the circuit board 152 pushes against the card guide 308, compressing the springs 310 further than any of the views provided in FIG. 12 or 16.

Riser brackets according to implementations of the present disclosure can be used in computing systems and computing devices (e.g., servers, desktops, etc.). The computing systems can have a chassis, and the riser brackets can be installed to or secured to the chassis. The computing systems can include one or more electronic components. The components, for example, may include a motherboard, fans, power supply units, hard drives, etc. PCIe cards can be connected to the motherboard using riser modules.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A riser bracket for a computing device, the riser bracket comprising:
 a plurality of structural members configured to receive a computing component; and
 an adjustable fixing bracket mechanically coupled to the plurality of structural members, the adjustable fixing bracket having a plurality of configurations that includes a first configuration and a second configuration, the adjustable fixing bracket having a first height in the first configuration that is greater than a second height in the second configuration, the adjustable fixing bracket including a first slide bracket that is slidably mounted to a support bracket, the support bracket being fixed relative to the first slide bracket and the plurality of structural members, the first slide bracket being slidable along the support bracket to change the adjustable fixing bracket between the first configuration and the second configuration;

wherein the plurality of structural members includes a back panel, a floor panel, and a side bracket, wherein the back panel is attached to the side bracket and the adjustable fixing bracket, and the floor panel is attached to the side bracket and the adjustable fixing bracket; and wherein the support bracket is attached to both the back panel and the floor panel.

2. The riser bracket of claim 1, further comprising:
a riser board attached to the plurality of structural members and configured to provide one or more slots for interfacing with a PCIe card.

3. The riser bracket of claim 1, wherein the back panel includes one or more ventilation openings.

4. The riser bracket of claim 1, wherein the first height is about the height of a full-height PCIe card and the second height is about the height of a half-height PCIe card.

5. The riser bracket of claim 1, wherein the adjustable fixing bracket further includes a card guide coupled to the support bracket, the card guide including one or more openings for ventilation.

6. The riser bracket of claim 1, wherein the adjustable fixing bracket further includes a second slide bracket mechanically coupled to the first slide bracket, wherein the second slide bracket is configured to slide in a direction orthogonal to the sliding direction of the first slide bracket.

7. The riser bracket of claim 6, wherein the second slide bracket, the first slide bracket, or both have a range of motion limited by one or more rails.

8. The riser bracket of claim 1, further comprising one or more screws to lock the adjustable fixing bracket in the first configuration and/or the second configuration.

9. The riser bracket of claim 1, wherein the first slide bracket, the support bracket, or both, include one or more openings for ventilation.

10. The riser bracket of claim 1, wherein a length of the first slide bracket is greater than a length of the support bracket, and a width of the first slide bracket is about the same as a width of the support bracket.

11. A computing device, comprising:
a chassis;
a motherboard coupled to the chassis; and
a riser bracket, including:
  a plurality of structural members configured to receive a computing component; and
  an adjustable fixing bracket mechanically coupled to the plurality of structural members, the adjustable fixing bracket having a plurality of configurations that includes a first configuration and a second configuration, the adjustable fixing bracket having a first height in the first configuration that is greater than a second height in the second configuration, the adjustable fixing bracket including
    a first slide bracket that is slidably mounted to a support bracket, the support bracket being fixed relative to the first slide bracket and the plurality of structural members, the first slide bracket being slidable along the support bracket to change the adjustable fixing bracket between the first configuration and the second configuration, and
    a second slide bracket that is slidably mounted to the first slide bracket, the second slide bracket being slidable along the first slide bracket to secure a PCIe card in the riser bracket.

12. The computing device of claim 11, wherein the first height is about the height of a full-height PCIe card and the second height is about the height of a half-height PCIe card.

13. The computing device of claim 11, wherein the adjustable fixing bracket further includes a card guide coupled to the support bracket, the card guide configured to engage with at least a portion of the PCIe card or at least a portion of an extender of the PCIe card.

14. The computing device of claim 13, wherein the card guide, the support bracket, the first slide bracket, or any combination thereof, includes one or more openings for ventilation.

15. The computing device of claim 11, wherein a sliding range of motion for the first slide bracket and/or the second slide bracket is restricted by one or more rails.

16. The computing device of claim 11, wherein the first slide bracket, the second slide bracket, or both, are prevented from sliding by one or more screws.

17. A riser bracket for a computing device, the riser bracket comprising:
a plurality of structural members configured to receive a computing component; and
an adjustable fixing bracket mechanically coupled to the plurality of structural members, the adjustable fixing bracket having a plurality of configurations that includes a first configuration and a second configuration, the adjustable fixing bracket having a first height in the first configuration that is greater than a second height in the second configuration, the adjustable fixing bracket including a slide bracket that is slidably mounted to a support bracket;
wherein the adjustable fixing bracket further includes a card guide coupled to the support bracket; and
wherein the card guide is coupled to the support bracket via a spring.

18. The riser bracket of claim 17, wherein the card guide includes one or more openings for ventilation.

19. A riser bracket for a computing device, the riser bracket comprising:
a plurality of structural members configured to receive a computing component; and
an adjustable fixing bracket mechanically coupled to the plurality of structural members, the adjustable fixing bracket having a plurality of configurations that includes a first configuration and a second configuration, the adjustable fixing bracket having a first height in the first configuration that is greater than a second height in the second configuration, the adjustable fixing bracket including a first slide bracket that is slidably mounted to a support bracket;
wherein the adjustable fixing bracket further includes a second slide bracket mechanically coupled to the first slide bracket, wherein the second slide bracket is configured to slide in a direction orthogonal to the sliding direction of the first slide bracket.

20. The riser bracket of claim 19, wherein the second slide bracket the first slide bracket, or both have a range of motion limited by one or more rails.

* * * * *